United States Patent [19]

Adachi

[11] Patent Number: 5,048,105

[45] Date of Patent: Sep. 10, 1991

[54] METHOD AND APPARATUS FOR ENLARGING OR REDUCING IMAGES

[75] Inventor: Yuuma Adachi, Kanagawa, Japan

[73] Assignee: Fuji Photo Film Co., Ltd, Kanagawa, Japan

[21] Appl. No.: 511,134

[22] Filed: Apr. 19, 1990

[30] Foreign Application Priority Data

Apr. 20, 1989 [JP] Japan .................. 64-101343

[51] Int. Cl.$^5$ ............................................. G06K 9/36
[52] U.S. Cl. ........................................ 382/47; 382/54
[58] Field of Search ............... 382/47, 42, 54; 358/77, 358/428, 451, 111; 364/577

[56] References Cited

U.S. PATENT DOCUMENTS

| 4,258,264 | 3/1981 | Kotera et al. | 250/484 |
| 4,276,473 | 6/1981 | Kato et al. | 250/327.1 |
| 4,315,318 | 2/1982 | Kato et al. | 364/515 |
| 4,387,428 | 6/1983 | Ishida et al. | 364/414 |
| 4,920,571 | 4/1990 | Abe et al. | 382/47 |
| 4,933,775 | 6/1990 | Shimura | 358/451 |

FOREIGN PATENT DOCUMENTS 56-11395  2/1981  Japan .

Primary Examiner—David K. Moore
Assistant Examiner—Yon Jung
Attorney, Agent, or Firm—Sughrue, Mion, Zinn, Macpeak & Seas

[57] ABSTRACT

From a series of primary image signal components of an image signal representing an image, secondary image signal components, which correspond to an enlarged image or a reduced image and the number of which is different from the number of the primary image signal components, are obtained from predetermined interpolating operation formulas. Values of coefficients in the predetermined interpolating operation formulas, which values correspond to a desired sharpness of an enlarged image or a reduced image, are calculated from values of the coefficients in the predetermined interpolating operation formulas, which values are different from each other and which values correspond to enlarged images or reduced images having the same scale of enlargement or the same scale of reduction and having different sharpness. Secondary image signal components are then obtained from the predetermined interpolating operation formulas in which the coefficients are set to the values thus calculated.

6 Claims, 2 Drawing Sheets

METHOD AND APPARATUS FOR ENLARGING OR REDUCING IMAGES

BACKGROUND OF THE INVENTION

1. Field of the Invention

This invention relates to an image enlarging or reducing method wherein, from a series of primary image signal components representing an image, secondary image signal components, which correspond to an enlarged image or a reduced image of said image the number of which is different from the number of the primary image signal components, are obtained from interpolating operations. This invention also relates to an apparatus for carrying out the image enlarging or reducing method.

2. Description of the Prior Art

Systems have heretofore been used widely wherein image signals representing images for medical purposes, or the like, are obtained with the X-ray CT, the MRI, or the like, and the images are reproduced as visible images from the image signals with image reproducing apparatuses, such as laser printers or CRT (cathode ray tube) display devices.

When certain kinds of phosphors are exposed to radiation such as X-rays, $\alpha$-rays, $\beta$-rays, $\gamma$-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored thereon during its exposure to the radiation. A phosphor exhibiting such properties is referred to as a stimulable phosphor. As disclosed in U.S. Pat. Nos. 4,258,264, 4,276,473, 4,315,318, 4,387,428, and Japanese Unexamined Patent Publication No. 56(1981)-11395, it has been proposed to use stimulable phosphors in radiation image recording and reproducing systems. Specifically, a sheet provided with a layer of the stimulable phosphor (hereinafter referred to as a stimulable phosphor sheet) is first exposed to radiation which has passed through an object, such as the human body. As a result, a radiation image of the object is stored on the stimulable phosphor sheet. The stimulable phosphor sheet is then scanned with stimulating rays, such as a laser beam, which cause it to emit light in proportion to the amount of energy stored during exposure to the radiation. The light emitted by the stimulable phosphor sheet, upon stimulation thereof, is photoelectrically detected and converted into an electric image signal. The image signal is then used during the reproduction of the radiation image of the object as a visible image on a display device, such as a CRT display device.

Radiation image recording and reproducing systems which use stimulable phosphor sheets are advantageous over conventional radiography using silver halide photographic materials, in that images can be recorded even when the energy intensity of the radiation to which the stimulable phosphor sheet is exposed varies over a wide range. More specifically, since the amount of light which the stimulable phosphor sheet emits when being stimulated varies over a wide range and is proportional to the amount of energy stored thereon during its exposure to the radiation, it is possible to obtain an image having a desirable density regardless of the energy intensity of the radiation to which the stimulable phosphor sheet was exposed. In order for the desired image density to be obtained, an appropriate read-out gain is set when the emitted light is being detected and converted into an electric signal (image signal) to be used in the reproduction of a radiation image as a visible image with an image reproducing apparatus, such as a laser printer or a CRT display device.

In the radiation image recording and reproducing systems described above, when a visible image is reproduced from an image signal with, for example, a laser printer, a visible image is often reproduced which has been enlarged or reduced in accordance with the size of a sheet of film, on which the visible image is to be reproduced, the number of visible images to be recorded on a single sheet of film, or the like. Also, in cases where a visible image is reproduced and displayed on a CRT display device, an enlarged image is often displayed so that details thereof can be observed, or a plurality of reduced images are often displayed so that they can be compared with each other.

In order for an enlarged image or a reduced image to be reproduced, from a series of primary image signal components of an image signal detected from an image, secondary image signal components, the number of which is different from the number of the primary image signal components, are obtained with an interpolating operation. An enlarged image or a reduced image is then reproduced from the secondary image signal components.

When visible images are reproduced with an image reproducing apparatus, such as a laser printer, from various image signals which have been obtained with various different image signal detecting apparatuses, such as X-ray CT scanners and MRI apparatuses, the visible images should be reproduced such that they have suitable sharpness. This is also necessary when visible images are reproduced with an image reproducing apparatus, such as a laser printer, from various image signals obtained from images which were recorded under different recording conditions in, for example, an X-ray image recording apparatus. Such recording conditions include, for example, what portion of an object is represented by the recorded image (e.g., the head, the chest, or the abdomen in cases where the object is a human body) and what mode was used when the image was recorded (e.g., a fluorographic mode, a direct image recording mode, or a contrasted image recording mode).

In order for the visible images having suitable sharpness to be reproduced, several types of interpolation processes have heretofore been prepared with which visible images having different sharpness can be obtained. One of the interpolation processes is selected, and secondary image signal components are obtained with the selected interpolation process from primary image signal components. The secondary image signal components are then used during the reproduction of a visible image.

Even if several types of interpolation processes are prepared in advance, it often occurs that a visible image becomes necessary which has intermediate image quality (sharpness) between visible images capable of being obtained from the prepared interpolation processes. However, with conventional techniques, such a visible image having intermediate image quality could not be obtained. Therefore, even when such a visible image having intermediate image quality is required, a visible image must be selected from those which can be obtained from the prepared interpolation processes and which have image quality different from the desired intermediate image quality.

SUMMARY OF THE INVENTION

The primary object of the present invention is to provide an image enlarging or reducing method with which visible images having an intermediate sharpness between a high sharpness (a sharp image) and a low sharpness (a smooth image) can also be obtained.

Another object of the present invention is to provide an apparatus for carrying out the image enlarging or reducing method.

The present invention provides an image enlarging or reducing method wherein, from a series of primary image signal components of an image signal representing an image, secondary image signal components, which correspond to an enlarged image or a reduced image of said image and the number of which is different from the number of the primary image signal components, are obtained from predetermined interpolating operation formulas, wherein the improvement comprises the steps of:

i) calculating the values of coefficients in said predetermined interpolating operation formulas, which values correspond to a desired sharpness of an enlarged image or a reduced image, from values of said coefficients in said predetermined interpolating operation formulas, which values are different from each other and which values correspond to enlarged images or reduced images having the same scale of enlargement or the same scale of reduction and having different sharpness, and ii) obtaining secondary image signal components from said predetermined interpolating operation formulas in which said coefficients are set to the calculated values.

The present invention also provides an image enlarging or reducing apparatus wherein, from a series of primary image signal components of an image signal representing an image, secondary image signal components, which correspond to an enlarged image or a reduced image of said image and the number of which is different from the number of the primary image signal components, are obtained from predetermined interpolating operation formulas. FIG. 1 is a block diagram showing the constitution of the image enlarging or reducing apparatus in accordance with the present invention. Specifically, the image enlarging or reducing apparatus in accordance with the present invention comprises:

i) a storage means (1) for storing information about values (C1 and C2) of said coefficients in said predetermined interpolating operation formulas, which values are different from each other and which values correspond to enlarged images or reduced images having the same scale of enlargement or the same scale of reduction and having different sharpness, ii) an input means (2) with which the information (I) representing a desired sharpness of an enlarged image or a reduced image is entered, iii) a coefficient operation means (3) which receives the information about said values (C1 and C2) of said coefficients from said storage means (1), receives the information (I) from said input means (2), and calculates values (Cn) of said coefficients in said predetermined interpolating operation formulas, which values correspond to the information (I), from said values (C1 and C2) of said coefficients, and iv) an interpolating operation means (4) which receives primary image signal components (S1), receives the information about the calculated values (Cn) of said coefficients from said coefficient operation means (3), and generates secondary image signal components (S2) from said predetermined interpolating operation formulas in which said coefficients are set to the calculated values (Cn).

In interpolation processes for obtaining the secondary image signal components S2, coefficient polynomial expressions of the first order (linear) to the third order (cubic) are used widely. The present invention is based on the findings that, when the values of the coefficients of the coefficient polynomial expressions are changed appropriately, the sharpness of a visible image can be changed while the scale of enlargement or the scale of reduction is kept unchanged.

With the image enlarging o reducing method in accordance with the present invention, values of coefficients in the predetermined interpolating operation formulas, which values correspond to a desired sharpness of an enlarged image or a reduced image, are calculated from values of the coefficients in the predetermined interpolating operation formulas, which values are different from each other and which values correspond to enlarged images o reduced images having the same scale of enlargement or the same scale of reduction and having different sharpness. Specifically, the values of coefficients in the predetermined interpolating operation formulas, which values correspond to a desired sharpness of an enlarged image or a reduced image, are calculated from values of the coefficients corresponding to a sharp visible image and values of the coefficients corresponding to a smooth visible image. The secondary image signal components are obtained from the predetermined interpolating operation formulas in which the coefficients are set to the calculated values. Therefore, a visible image can be obtained which has an arbitrary intermediate sharpness between the sharp visible image and the smooth visible image.

The image enlarging or reducing apparatus in accordance with the present invention comprises the storage means 1, the input means 2, the coefficient operation means 3, and the interpolating operation means 4. Therefore, with the image enlarging or reducing apparatus in accordance with the present invention, the image enlarging or reducing method in accordance with the present invention can be carried out, and the secondary image signal components S2 corresponding to a visible image having a desired sharpness can be obtained.

DESCRIPTION OF THE PREFERRED EMBODIMENTS

The present invention will hereinbelow be described in further detail with reference to the accompanying drawings.

In an embodiment described below, a radiation image stored on a stimulable phosphor sheet is detected and enlarged to a size two times the size of the radiation image.

Figure 1:
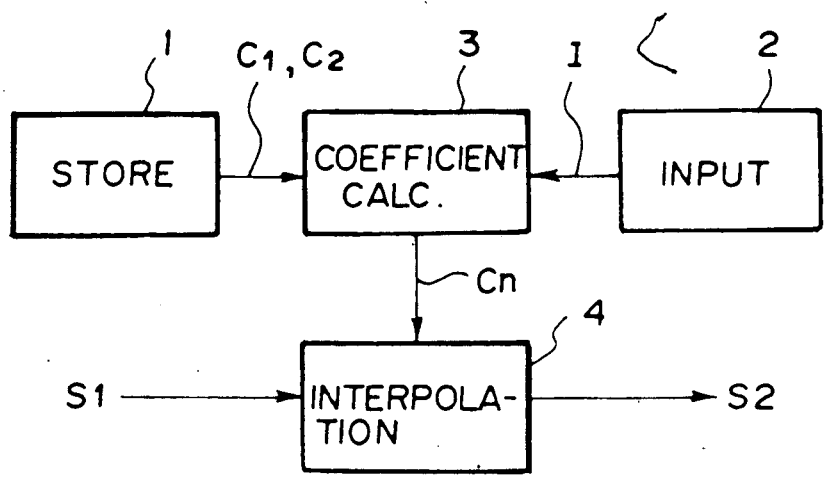
FIG. 1 is a block diagram showing the constitution of the image enlarging or reducing apparatus in accordance with the present invention.
Figure 2:
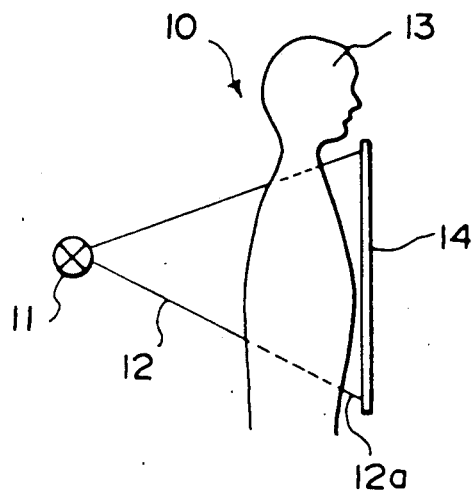
FIG. 2 is a schematic view showing an example of a radiation image recording apparatus.

FIG. 2 is a schematic view showing an example of a radiation image recording apparatus.

With reference to FIG. 2, radiation 12 is produced by a radiation source 11 of a radiation image recording apparatus 10. The radiation 12 passes through an object 13, such as a human body. Radiation 12a, which has passed through the object 13, impinges upon a stimulable phosphor sheet 14. In this manner, a radiation image of the object 13 is stored on the stimulable phosphor sheet 14.

Figures 3, 4A, 4B:
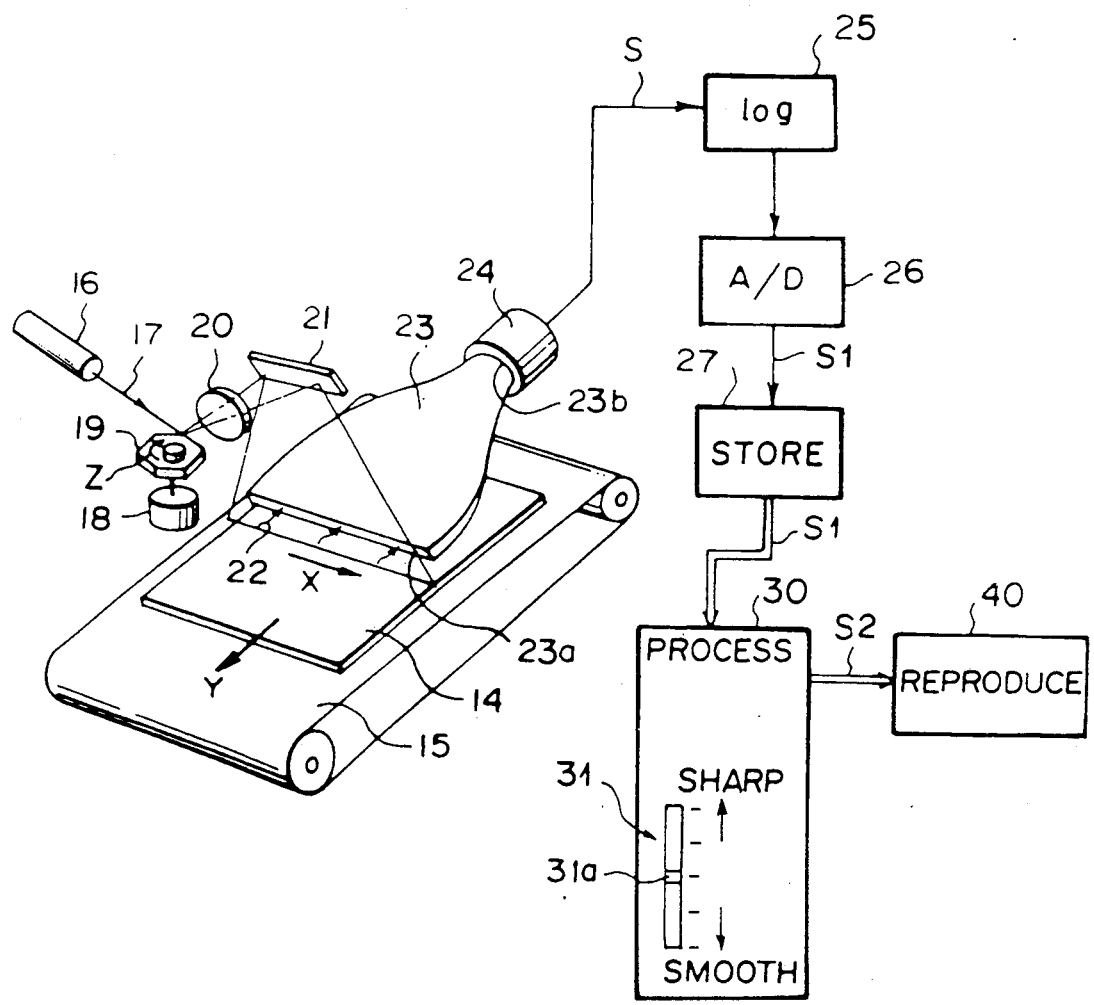
FIG. 3 is a perspective view showing an example of a radiation image read-out apparatus.
FIGS. 4A and 4B are explanatory views showing sampling points on a stimulable phosphor sheet as an aid in the explanation of how an example of an image enlarging process is carried out in an image processing apparatus.

FIG. 3 is a perspective view showing an example of a radiation image read-out apparatus.

The stimulable phosphor sheet 14, on which the radiation image has been stored in the manner described above, is placed at a predetermined position in the radiation image read-out apparatus.

With reference to FIG. 3, the stimulable phosphor sheet 14 is conveyed in a sub-scanning direction indicated by the arrow Y by a sheet conveyance means 15, which is constituted of an endless belt or the like and which is operated by an operating means (not shown). A laser beam 17, which serves to provide stimulating rays, is produced by a laser beam source 16. The laser beam 17 is reflected and deflected by a rotating polygon mirror 19, which is being quickly rotated by a motor 18 in the direction indicated by the arrow Z. The laser beam 17 then passes through a converging lens 20, which is constituted of an $f\theta$ lens or the like. The direction of the optical path of the laser beam 17 is then changed by a mirror 21, and the laser beam 17 is caused to impinge upon the stimulable phosphor sheet 14 and scan it in a main scanning direction indicated by the arrow X. The main scanning direction is approximately normal to the sub-scanning direction indicated by the arrow Y. When the stimulable phosphor sheet 14 is exposed to the laser beam 17, the exposed portion of the stimulable phosphor sheet 14 emits light 22 in an amount proportional to the amount of energy stored thereon during its exposure to the X-rays. The emitted light 22 is guided by a light guide member 23, and photoelectrically detected by a photomultiplier 24. The light guide member 23 is made from a light guiding material, such as an acrylic plate. The light guide member 23 has a linear light input face 23a, positioned to extend along the main scanning line on the stimulable phosphor sheet 14, and a ring-shaped light output face 23b, positioned so that it is in close contact with a light receiving face of the photomultiplier 24. The emitted light 22, which has entered the light guide member 23 from its light input face 23a, is guided through repeated total reflection inside of the light guide member 23, emanates from the light output face 23b, and is received by the photomultiplier 24. In this manner, the amount of the emitted light 22, which amount represents the radiation image stored on the stimulable phosphor sheet 14, is converted into an electric signal by the photomultiplier 24.

An analog signal S generated by the photomultiplier 24 is logarithmically amplified by a logarithmic amplifier 25, and fed into an A/D converter 26. The A/D converter 26 samples the analog signal S at time intervals corresponding to the predetermined sampling intervals on the stimulable phosphor sheet 14. The sampled signal is converted into a digital image signal made up of a series of primary image signal components S1. The primary image signal components S1 stored in a storage means 27, and thereafter fed therefrom into an image processing apparatus 30.

The image processing apparatus 30 constitutes an embodiment of the image enlarging or reducing apparatus in accordance with the present invention. The image processing apparatus 30 is provided with an input means 31 with which the information representing a desired sharpness is entered into the apparatus. The input means 31 is provided with a knob 31a which can be moved vertically and with which a desired sharpness is designated. When the knob 31a is moved to the top position, a sharpest image is designated. When the knob 31a is moved to the bottom position, a smoothest image is designated. The knob 31a can be moved to an arbitrary position, which position is taken in the vertical direction. Therefore, any of images having an intermediate sharpness between the sharpest image and the smoothest image can be designated.

FIGS. 4A and 4B are explanatory views showing some of sampling points on the stimulable phosphor sheet 14 as an aid in the explanation of how an example of an image enlarging (reducing) process is carried out in the image processing apparatus 30.

In FIG. 4A, black dots represent sampling point ai (i=1, 2, ...) on the stimulable phosphor sheet 14. As an aid in simplification of explanation, only part of a single row or column among a plurality of rows and columns making up the primary two-dimensional sampling point array is shown (assume that a row is shown in this case). Also, both the sampling points and the primary image signal components S1 corresponding to the sampling points are denoted by ai (i=1, 2, ...).

In FIG. 4B, white circles represent the sampling points b1 (l=1, 2, ...) on the stimulable phosphor sheet 14, which correspond to secondary image signal components obtained from the primary image signal components ai (i=1, 2, ...). In FIG. 4B, as in FIG. 4A, only part of a single row or column among a plurality of rows and columns making up the secondary two-dimensional sampling point array is shown (assume that a row is shown in this case). Also, both the sampling points and the secondary image signal components S2 corresponding to the sampling points are denoted by b1 (l=1, 2, ...). Assume that the sampling points ai and b1 coincide with each other.

The cases will be described hereinbelow wherein calculations are made to find the secondary image signal components b1 (l= ..., −2, 0, 2, 4, ...), which correspond to the sampling points of the primary image signal components ai (i=1, 2, ...), and the secondary image signal components b1 (l= ..., −1, 1, 3, ...), which correspond to intermediate sampling points between these sampling points. The operations for thus obtaining the secondary image signal components, the number of which secondary image signal components is two times the number of the primary image signal components in each of two dimensions, correspond to the formation of a visible image which has been enlarged to a size two times the size of the original image in each of two dimensions. In this example, coefficient polynomial expressions of the third order are used, and a visible image is obtained which has been enlarged to a size two times the size of the original image.

In cases where the secondary image signal components b1 (1= ..., −2, 0, 2, 4, ...) are to be obtained, which correspond to the sampling points of the primary image signal components ai (i=1, 2, ...), the values C1 and C2 of the coefficients of the coefficient polynomial expressions of the third order, which values respectively correspond to the sharpest image and the smoothest image, are set to $$C1 = (0.0\ 1.0\ 0.0\ 0.0)\ldots \quad (1)$$

$$C2 = (0.167\ 0.667\ 0.167\ 0.0)\ldots \quad (2)$$

In cases where the secondary image signal components b1 (1= ..., −1, 1, 3, ...), which correspond to intermediate sampling points between ai (i=1, 2, ...) and ai+1 (i=1, 2, ...) are to be obtained, the values C1 and C2 of the coefficients are used which are expressed as $$C1 = (-0.0625\ 0.5625\ 0.5625\ -0.0625)\ldots \quad (3)$$

$$C2 = (0.021\ 0.479\ 0.479\ 0.021)\ldots \quad (4)$$

The information about the values of the coefficients expressed as Formulas (1), (2), (3), and (4) is stored in a storage means (not shown) of the image processing apparatus 30. The values of the coefficients are determined in advance for respective scales of enlargement (respective scales of reduction), and the information about the values is stored in the storage means.

In this example, sharpness is denoted by t such that t=1.0 when the sharpest image is designated with the input means 31 shown in FIG. 3, and t=0.0 when the smoothest image is designated. Also, when an image having an intermediate sharpness is designated, the value of t is large within the range of $0 \leq t \leq 1$ as the sharpness is high.

In this case, values Cn of the coefficients in the interpolating operation formulas (coefficient polynomial expressions) are calculated, with which values the secondary image signal components S2 representing an image having a sharpness corresponding to the setting position of the knob 31a of the input means 31 (the set value of t) can be obtained. The values Cn of the coefficients are calculated from the formula expressed as $$Cn = t \cdot C1 + (1-t) \cdot C2 \ldots \quad (5)$$

Specifically, in cases where the secondary image signal components b1 (1= ..., −2, 0, 2, 4, ...) are to be obtained, when t=0.8 (a slightly sharp image) is designated, the values Cn of the coefficients are calculated from Formulas (1), (2), and (5), i.e. from the formula expressed as $$\begin{aligned} Cn &= 0.8 \times (0.0\ 1.0\ 0.0\ 0.0) + \\ &\quad 0.2 \times (0.167\ 0.667\ 0.167\ 0.0) \\ &= (0.033\ 0.933\ 0.033\ 0.0) \end{aligned} \quad (6)$$

In cases where the secondary image signal components b1 (1= ..., −1, 1, 3, ...) are to be obtained, when t=0.8 is designated, the values Cn of the coefficients are calculated from Formulas (3), (4), and (5), i.e. from the formula expressed as $$\begin{aligned} Cn &= 0.8 \times (-0.0625\ 0.5625\ 0.5625\ -0.0625) + \\ &\quad 0.2 \times (0.021\ 0.479\ 0.479\ 0.021) \\ &= (-0.046\ 0.546\ 0.546\ -0.046) \end{aligned} \quad (7)$$

The functions of the image processing apparatus 30 for making calculations from Formula (5), i.e. from Formulas (6) and (7), constitute an example of the coefficient operation means of the image enlarging or reducing apparatus in accordance with the present invention.

The secondary image signal components b1 are obtained from the formula expressed as $$\begin{aligned} b1 &= (0.033\ 0.933\ 0.033\ 0.0) \begin{pmatrix} ai-1 \\ ai \\ ai+1 \\ ai+2 \end{pmatrix} \\ &= 0.033\ ai-1 + 0.933\ ai + 0.033\ ai+1 \end{aligned} \quad (8)$$

wherein the values Cn of the coefficients calculated from Formula (6) ar used. From Formula (7), the secondary image signal components b1+1 are obtained from the formula expressed as $$\begin{aligned} b1+1 &= (-0.046\ 0.546\ 0.546\ -0.046) \begin{pmatrix} ai-1 \\ ai \\ ai+1 \\ ai+2 \end{pmatrix} \\ &= -0.046\ ai-1 + 0.546\ ai + 0.546\ ai+1 - \\ &\quad 0.046\ ai+2 \end{aligned} \quad (9)$$

Actually, formulas for operations in two dimensions extended from the operations in one dimension described above are used, and the interpolating operations (enlargement operations) are carried out on the image signal components representing the image information stored on the whole surface of the stimulable phosphor sheet 14 shown in FIG. 3. In this manner, the secondary image signal components S2 are generated. The functions of the image processing apparatus 30 for carrying out the two-dimensional operations from Formulas (8) and (9) constitute an example of the interpolating operation means of the image enlarging or reducing apparatus in accordance with the present invention.

The secondary image signal components S2 obtained from the image processing apparatus 30 shown in FIG. 3 are fed into an image reproducing apparatus 40, which may be constituted of a laser printer or a CRT display device. The image reproducing apparatus 40 reproduces a visible image, which has a sharpness corresponding to the setting position of the knob 31a of the input means 31, from the secondary image signal components S2.

In the embodiment described above, a visible image is obtained which has been enlarged to a size two times the size of the original image. However, in the image enlarging or reducing method and apparatus in accordance with the present invention, no limitation is imposed on the scale of enlargement. Also, a visible image which has been reduced may be obtained instead of the enlarged image. Additionally, in the aforesaid embodiment, the image signal detected from a stimulable phosphor sheet is processed. However, the image signal may be detected with any of other types of image signal detecting apparatus. The image enlarging or reducing method and apparatus in accordance with the present invention is widely applicable when secondary image signal components corresponding to an enlarge image or a reduced image are to be obtained from interpolating operations from primary image signal components representing an original image. The coefficient polynomial expressions used are not limited to those of the third order, but may be of the first order, the second order (quadratic), or of the order higher than the third order.

I claim:

1. An image enlarging or reducing method wherein, from a series of primary image signal components of an image signal representing an image, secondary image signal components, which correspond to an enlarged image or a reduced image of said image, the number of which is different from the number of the primary image signal components, are obtained from predetermined interpolating operation formulas, wherein the improvement comprises the steps of:
   i) calculating values of coefficients in said predetermined interpolating operation of formulas, said calculated values corresponding to a desired sharpness of an enlarged image or a reduced image, said calculated values varying according to desired sharpness, yet said values corresponding to the degree to which said image is enlarged or reduced by said predetermined interpolating operation formula, and said values having a coinciding scale of enlargement or a coinciding scale of reduction, but having different sharpness, and
   ii) obtaining secondary image signal components from said predetermined interpolating operation formulas in which said coefficients are set to the calculated values.

2. A method as defined in claim 1 wherein said image represented by said image signal made up of a series of said primary image signal components is a radiation image.

3. An image enlarging or reducing apparatus wherein, from a series of primary image signal components of an image signal representing an image, secondary image signal components, which correspond to an enlarged image or a reduced image of said image, the number of which is different from the number of the primary image signal components, are obtained from predetermined interpolating operation formulas, the image enlarging or reducing apparatus comprising:
   i) a storage means for storing information about values of said coefficients in said predetermined interpolating operation formulas, said values varying according to desired sharpness, and said values corresponding to enlarged images or reduced images having a coinciding scale of enlargement or a coinciding scale of reduction, but having different sharpness,
   ii) an input means with which information representing a desired sharpness of an enlarged image or a reduced image is entered,
   iii) a coefficient operation means which receives said information about said values of said coefficients from said storage means, receives said information representing a desired sharpness of an enlarged image or a reduced image from said input means, and calculates values of said coefficients in said predetermined interpolating operation formulas, said calculated values corresponding to said desired sharpness information received from said input means, from said values of said coefficients which are represented by said information received from said storage means, and
   iv) an interpolating operation means which receives said information about said calculated values of said coefficients from said coefficient operation means, and generates secondary image signal components from said predetermined interpolating operation formulas in which said coefficients are set to said calculated values.

4. An apparatus as defined in claim 3 wherein said image represented by said image signal made up of a series of said primary image signal components is a radiation image.

5. An image enlarging or reducing method as defined in claim 1 wherein a sharpness coefficient C1 corresponding to a value for a sharpest image and a smoothness coefficient C2 corresponding to a value for a smoothest image are provided for each degree of enlargement and are utilized to calculate the value of one of said coefficients Cn for a desired sharpness t ($0 \leq t \leq 1$) for each degree of enlargement according to the formula:

$$Cn = t \times C1 + (1-t) \times C2.$$

6. An image enlarging or reducing apparatus as defined in claim 3 wherein a sharpness coefficient C1 corresponding to a value for a sharpest image and a smoothness coefficient C2 corresponding to a value for a smoothest image are provided for each degree of enlargement and are utilized to calculate the value of one of said coefficients Cn for a desired sharpness t ($0 \leq t \leq 1$) for each degree of enlargement according to the formula:

$$Cn = t \times C1 + (1-t) \times C2.$$

* * * * *